US010283630B2

(12) United States Patent
Benkhelifa

(10) Patent No.: US 10,283,630 B2
(45) Date of Patent: May 7, 2019

(54) SEMICONDUCTOR DEVICE

(71) Applicant: Fraunhofer-Gesellschaft Zur Förderung Der Angewandten Forschung E.V., München (DE)

(72) Inventor: Fouad Benkhelifa, Freiburg (DE)

(73) Assignee: Fraunhofer-Gesellschaft Zur Forderung Der Angewandten Forschung E.V., Munich (DE)

( * ) Notice: Subject to any disclaimer, the term of this patent is extended or adjusted under 35 U.S.C. 154(b) by 0 days.

(21) Appl. No.: 15/634,210

(22) Filed: Jun. 27, 2017

(65) Prior Publication Data

US 2017/0373177 A1    Dec. 28, 2017

(30) Foreign Application Priority Data

Jun. 27, 2016  (DE) .................. 10 2016 211 532
Jun. 26, 2017  (DE) .................. 10 2017 210 711

(51) Int. Cl.
*H01L 29/778*   (2006.01)
*H01L 29/10*    (2006.01)
(Continued)

(52) U.S. Cl.
CPC ...... *H01L 29/7783* (2013.01); *H01L 29/1075* (2013.01); *H01L 29/201* (2013.01);
(Continued)

(58) Field of Classification Search
CPC ............. H01L 29/1075; H01L 29/2003; H01L 29/201; H01L 29/205; H01L 29/207;
(Continued)

(56) References Cited

U.S. PATENT DOCUMENTS 6,316,793 B1 *  11/2001  Sheppard ............ H01L 29/1608
                                                          257/103
7,576,373 B1     8/2009   Nikita et al.
(Continued)

FOREIGN PATENT DOCUMENTS

EP           1222312 B1    12/2004

OTHER PUBLICATIONS

Cai, Yong et al., "High-performance enhancement-mode AlGaN/GaN HEMTs using fluoride-based plasma treatment", IEEE Electron Device Lett., vol. 26, No. 7, pp. 435-437, 2005.
(Continued)

*Primary Examiner* — Allan R Wilson
(74) *Attorney, Agent, or Firm* — Alix, Yale & Ristas, LLP

(57) ABSTRACT

The invention relates to a semiconductor component comprising at least one field effect transistor, said transistor comprising at least a back barrier layer, a buried layer arranged on the back barrier layer, a channel layer arranged on the buried layer, a barrier layer arranged on the channel layer, and a gate layer arranged on the barrier layer, wherein the barrier layer comprises $Al_zGa_{1-z}N$ and wherein the buried layer comprises $Al_xGa_{1-x}N$ and at least one dopant causing a p-type conductivity, and wherein the gate layer comprises any of GaN and/or $Al_uIn_vGa_{1-v-u}N$. A field effect transistor according to the disclosure may be configured to show a gate threshold voltage which is higher than approximately 0.5 V or higher than approximately 1.0 V.

19 Claims, 7 Drawing Sheets

(51) Int. Cl.
| | |
|---|---|
| H01L 29/20 | (2006.01) |
| H01L 29/205 | (2006.01) |
| H01L 29/207 | (2006.01) |
| H01L 29/34 | (2006.01) |
| H01L 29/417 | (2006.01) |
| H01L 29/423 | (2006.01) |
| H01L 29/43 | (2006.01) |
| H01L 29/201 | (2006.01) |

(52) U.S. Cl.
CPC ........ *H01L 29/2003* (2013.01); *H01L 29/205* (2013.01); *H01L 29/207* (2013.01); *H01L 29/34* (2013.01); *H01L 29/41758* (2013.01); *H01L 29/42316* (2013.01); *H01L 29/432* (2013.01)

(58) Field of Classification Search
CPC ............... H01L 29/34; H01L 29/41758; H01L 29/42316; H01L 29/432; H01L 29/7783
See application file for complete search history.

(56) References Cited

U.S. PATENT DOCUMENTS

| | | | |
|---|---|---|---|
| 7,728,356 | B2 | 6/2010 | Suh et al. |
| 8,404,508 | B2 | 3/2013 | Lidow et al. |
| 8,890,212 | B2 | 11/2014 | Jeon et al. |
| 8,987,011 | B2 | 3/2015 | Kohler et al. |
| 9,269,801 | B2 | 2/2016 | Twynam |
| 2002/0066908 | A1* | 6/2002 | Smith ............... H01L 29/42316 257/194 |
| 2005/0116319 | A1* | 6/2005 | Twynam ............. H01L 29/0817 257/565 |
| 2006/0255364 | A1* | 11/2006 | Saxler ................. H01L 29/2003 257/192 |
| 2008/0105880 | A1* | 5/2008 | Edwards ........... H01L 29/66462 257/76 |
| 2011/0018002 | A1* | 1/2011 | Chen ................. H01L 21/28575 257/76 |
| 2013/0306984 | A1 | 11/2013 | Twynam |
| 2016/0111520 | A1* | 4/2016 | Liu ................... H01L 29/66462 438/172 |
| 2017/0294528 | A1* | 10/2017 | Ren ..................... H01L 29/4175 |

OTHER PUBLICATIONS

Chu, Rongming et al., "1200-V normally off GaN-on-Si field-effect transistors with low dynamic on-resistance," IEEE Electron Device Lett., vol. 32, pp. 632-634, 2011.

Chu, Rongming et al., "V-gate GaN HEMTs for X-band power applications," IEEE Electron Device Lett., vol. 29, No. 9, pp. 974-976, Sep. 2008.

Hamady, Saleem et al., "Hybrid normally-off AlGaN/GaN HEMT using GIT technique with a p-region below the channel", Compound Semiconductor Week (CSW) 2014 Conference, May 2014, Montpellier.

Hwang, Injun et al., "p-GaN gate HEMTs with tungsten gate metal for high threshold voltage and low gate current", IEEE Electron Device Lett., vol. 34, No. 2, pp. 202-204, 2013.

Ikeda, Nariaki et al., "High power AlGaN/GaN HFET with a high breakdown voltage of over 1.8 kV on 4 inch Si substrates and the suppression of current collapse", Proceeding 20th Int. Symp. Power Semiconductor Devices IC's, ISPSD, pp. 287-290, 2008.

Kim, Hyeongnam et al., "Polarization-Engineered Ga-Face GaN-Based Heterostructures for normally-Off Heterostructure Field-Effect Transistors", Journal of Electronic Materials, vol. 42, No. 1, pp. 10-13 , 2013.

Litchfield, Michael et al., "High-Efficiency X-Band Amplifiers Operating as Rectifiers", Microwave Symposium (IMS), 2014 IEEE MTT-S International, Tampa, Florida, Jun. 2014.

Mizutani, Takashi et al., "Normally off AlGaN/GaN high electron mobility transistors with p-InGaN cap layer", J. Appl. Phys. 113, 034502, 2013.

Morita, Tatsuo et al., "99.3% Efficiency of Three-Phase Inverter for Motor Drive Using GaN-based Gate Injection Transistors", Applied Power Electronics Conference and Exposition (APEC), pp. 481-484, 2011.

Parikh, Primit et al., "Commercialization of high 600V GaN-on-silicon power HEMTs and diodes", Energytech Conference, 2013 IEEE, pp. 1-5, Cleveland, OH, 2013.

Pengelly, Raymond S. et al., "A review of GaN on SiC High Electron-Mobility Power Transistors and MMICs", IEEE Transactions on microwave theory and techniques, vol. 60, No. 6, pp. 1764-1783, 2012.

Shinohara, Keistuke et al., "Scaling of GaN HEMTs and Schottky diodes for submillimeter-wave MMIC applications," IEEE Trans. Electron Devices 60, pp. 2982-2996, 2013.

Tang, Zhikai et al., "600-V Normallyoff SiNx/AlGAN/GaN MIS-HEMT With Large Gate Swing and Low Current Collapse", IEEE Electron Device Lett., vol. 34, No. 11, pp. 1373-1375, 2013.

Ueda, Tetsuzo et al., "GaN transistors on Si for switching and high frequency applications", Japanese Journal of Applied Physics, vol. 53, 100214, 2014.

Wang, Ye et al., "High-Performance Normally-off Al2O3/GaN MOSFET Using a Wet Etching-Based Gate Recess Technique", IEEE Electron Device Lett., vol. 34, No. 11, pp. 1370-1372, 2013.

Yanagihara, Manabu et al., "Recent advances in GaN transistors for future emerging applications", Phys. Status Solidi A 206, No. 6, pp. 1221-1227, 2009.

* cited by examiner

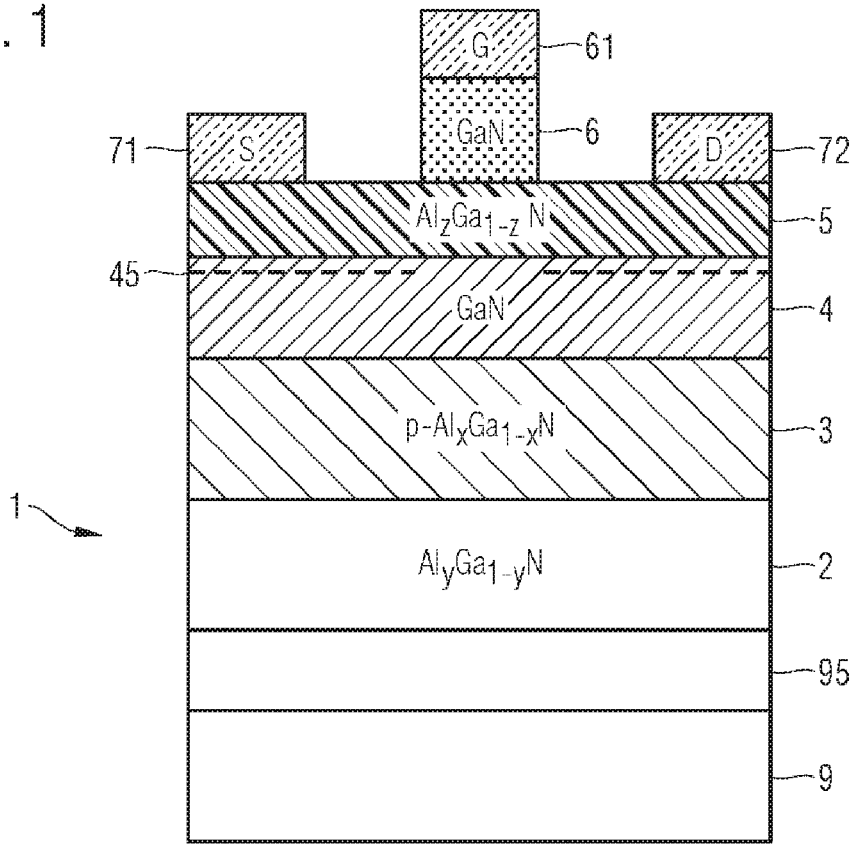
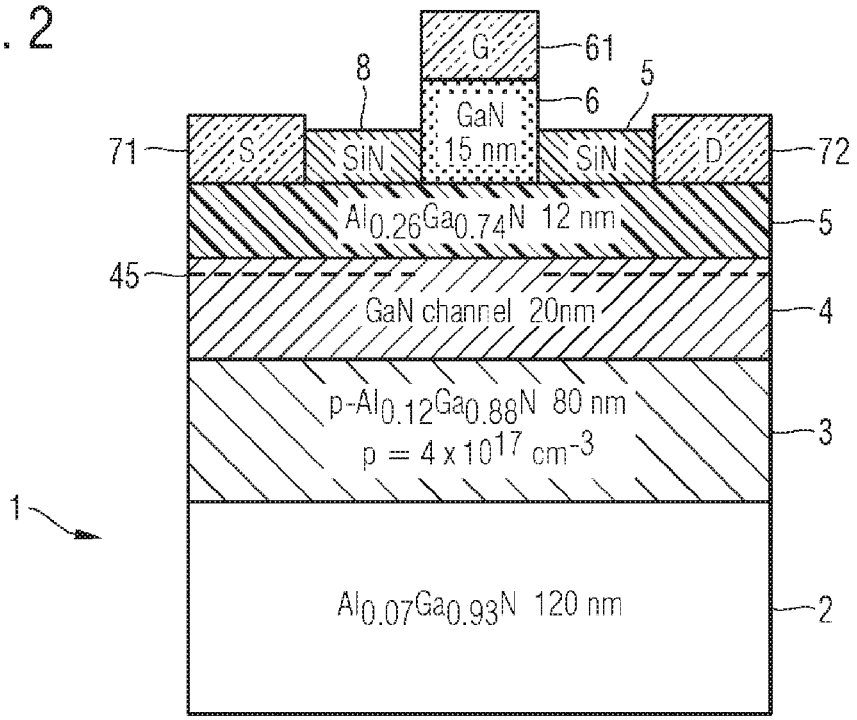

SEMICONDUCTOR DEVICE

FIELD OF THE DISCLOSURE

The invention relates to a semiconductor component comprising at least one field effect transistor comprising a back barrier layer, a buried layer arranged on the back barrier layer, a channel layer arranged on the buried layer, a barrier layer arranged on the channel layer, and a gate layer arranged on the barrier layer, wherein the barrier layer comprises or consists of a group-III-nitride like AlGaN. Semiconductor components of this type may be used, by way of example, as switching transistors for power electronics.

BACKGROUND

It is known from K. Hyeongnam, N. Digbijoy, R. Siddharth and L. Wu: Polarization-Engineered Ga-Face GaN-Based Heterostructures for Normally-Off Heterostructure Field-Effect Transistors; J. of Electronic Materials, Vol. 42, No. 1 2013, to manufacture a field effect transistor comprising five different semiconductor layers deposited one above another. Firstly, a back barrier layer comprising GaN is deposited on a substrate. That is followed by a buried layer comprising undoped AlGaN or p-doped GaN. A channel layer comprising GaN is produced thereon. A barrier layer composed of AlGaN forms the termination. An additional gate layer composed of GaN is situated below the metallic gate contact. If no electrical voltage is present at the gate electrode, the Fermi level is below the conduction band minimum. Consequently, the channel of the field effect transistor is insulating. Such a transistor is referred to as a normally off transistor in the following description. As a result of a positive voltage being applied to the gate electrode, the Fermi level shifts above the conduction band minimum, with the result that the transistor becomes conducting.

This known transistor has the disadvantage that the gate threshold voltage at which the current flow in the channel commences is as low as only 200 mV. This has the effect that circuit design including the known transistor becomes very complex since the gate voltage has to be controlled very accurately. Furthermore, the known transistor has the disadvantage that the charge carrier concentrations in the conduction band are very low, which results in a low current density in the channel.

WO 2011/023607 A1 discloses a power transistor on the basis of group III nitrides, which power transistor has fast switching frequencies and has a low channel resistance, such that this known transistor can provide a high output power. However, this known transistor has the disadvantage that the channel is conducting if no gate voltage is present. In order to switch the channel to high resistance and to block the current flow through the transistor, a negative gate voltage is required. Such a transistor is referred to as a normally on transistor in the description hereinafter. This transistor has the disadvantage that complex protective circuits are required in order to avoid destruction of the transistor or of assemblies connected thereto in the case of a fault.

Thus, it is an object of the invention to provide a field effect transistor which shows normally off operation and having the capability of switching any of high electrical power and/or high frequencies. Furthermore, it is an object of the invention to provide a normally on transistor having a higher threshold voltage.

SUMMARY OF THE INVENTION

The invention relates in some embodiments to a semiconductor component comprising at least one field effect transistor, said transistor comprising at least a back barrier layer, a buried layer arranged on the back barrier layer, a channel layer arranged on the buried layer, a barrier layer arranged on the channel layer, and a gate layer arranged on the barrier layer, wherein the barrier layer comprises $Al_zGa_{1-z}N$ and wherein the buried layer comprises $Al_xGa_{1-x}N$ and at least one dopant causing a p-type conductivity, and wherein the gate layer comprises any of GaN and/or $Al_uIn_vGa_{1-v-u}N$.

In another embodiment, the invention relates to a semiconductor component comprising at least one field effect transistor, said transistor comprising at least a back barrier layer, a buried layer arranged on the back barrier layer, a channel layer arranged on the buried layer, a barrier layer arranged on the channel layer, and a gate layer arranged on the barrier layer, wherein the barrier layer consists of $Al_zGa_{1-z}N$, wherein the buried layer comprises $Al_xGa_{1-x}N$ and at least one dopant causing a p-type conductivity in a concentration of at least $1 \cdot 10^{18}$ cm$^{-3}$ and not more than $2 \cdot 10^{20}$ cm$^{-3}$, and the gate layer consists of any of GaN or $Al_uIn_vGa_{1-v-u}N$.

The semiconductor component may be a single field effect transistor. In other embodiments of the invention, the semiconductor component may comprise or consist of a plurality of field effect transistors. In addition, the semiconductor component may comprise further monolithically integrated components, for example bipolar transistors, resistors, capacitors, diodes or any other elements known in the art. In this respect, the semiconductor component may be any of an monolithically integrated circuit or a hybrid circuit comprising any of a power converter, an amplifier, a motor controller or the like.

The field effect transistor according to the invention comprises a plurality of layers of semiconductor materials, each having a different composition and/or doping, which are deposited on a substrate. In some embodiments of the invention, the substrate may comprise or consist of any of SOI (Silicon-on-insulator) and/or $Al_2O_3$ and/or SiC and/or Si and/or GaN and/or $SiO_2$. In some embodiments of the invention the substrate itself may consist of a plurality of individual layers being made from different materials. The substrate may optionally be removed after the manufacturing of the field effect transistor or of the semiconductor component, for example by wet- or dry-chemical etching.

In some embodiments of the invention, a buffer layer is deposited on the substrate, said buffer layer being configured to compensate for or match differences in the lattice constant and/or the thermal expansion coefficients between the substrate and the subsequent layers. In some embodiments of the invention the buffer layer itself may consist of a plurality of individual layers being made from different materials.

A back barrier layer is deposited on the substrate or on the optional buffer layer. In some embodiments of the invention, the back barrier layer may contain or consist of $Al_yGa_{1-y}N$. If a separate buffer layer is not present, the back barrier layer may also serve to reduce lattice mismatches between the substrate and subsequent layers. In addition, the back barrier layer may provide an electrical insulation, such that adjacent components are not electrically connected via the substrate.

According to the invention, a buried layer is deposited on the back barrier layer. In some embodiments of the invention, the buried layer may comprise $Al_xGa_{1-x}N$. In some embodiments of the invention, the aluminum content of the buried layer may be greater than the aluminum content of the back barrier layer. The buried layer may contain a p-type dopant. The dopant may comprise at least one element of the following list: magnesium, carbon, zinc, and beryllium. In some embodiments of the invention, the buried layer may be a multilayer system, i.e. the buried layer may be composed of a plurality of individual layers being deposited one above the other.

At least one channel layer is arranged on the buried layer. In some embodiments, the channel layer may comprise or consist of GaN or AlGaN. At least one optional intermediate layer may be arranged between the buried layer and the channel layer.

A barrier layer comprising or consisting of $Al_zGa_{1-z}N$ is arranged on the channel layer. This has the effect that a two-dimensional electron gas forms at the interface between the barrier layer and the channel layer at least in some operating states. The two-dimensional electron gas which forms at the semiconductor heterostructure between the barrier layer and the channel layer may have a greater charge carrier mobility than a correspondingly doped volume semiconductor. As a result, the electrical on-resistance of the channel and hence the conduction power loss of the field effect transistor may be reduced in some embodiments.

A gate layer is arranged on the barrier layer. The gate layer is present at least in that partial area of the surface of the semiconductor component which is occupied by the gate contact. Other partial areas, for example below the source or drain contact or intermediate regions between source or drain contact, may not comprise a gate layer. In some embodiments of the invention, the gate layer comprises nominally undoped GaN. This does not exclude that the gate layer may contain unavoidable impurities.

According to the invention the buried layer and the gate layer may induce polarization charges causing an electrical field across the channel, said field having the effect that the Fermi level is located below the conduction band minimum if no gate voltage is present at the gate electrode of the field effect transistor. This means that the transistor manufactured according to the invention exhibits a "Normally Off" behavior, i.e. the transistor is in a high-resistance or non-conducting state if no gate voltage is present.

In some embodiments, the field effect transistor may be easily manufactured since the manufacturing method does not involve an ion implantation step. All of the layers described may be deposited by epitaxial deposition methods known in the art, for example by means of MBE, MOVPE or MOCVD. These methods allow simple process control, such that the current-carrying capacity and the threshold voltage can be predicted with high accuracy and the transistor can be manufactured in large quantities with low tolerances. By adapting the layer thicknesses, the dopant concentration and/or the aluminum content of the different AlGaN layers, it is possible to set both the current-carrying capacity and the threshold voltage within wide limits, such that the basic structure proposed according to the invention is suitable for providing transistors having different electrical properties.

In some embodiments of the invention, the gate layer may have a thickness of between approximately 10 nm and approximately 100 nm. In other embodiments of the invention, the gate layer may have a thickness of between approximately 10 nm and approximately 40 nm. In still other embodiments of the invention, the gate layer may have a thickness of between approximately 10 nm and approximately 20 nm or between approximately 10 nm and approximately 15 nm. In still other embodiments of the invention, the gate layer may have a thickness of between approximately 20 nm and approximately 40 nm. In this case, the thickness may be chosen such that the separation between Fermi level and conduction band minimum at the interface between the barrier layer and the channel layer is maximized in order to promote a higher threshold voltage. In some embodiments of the invention, the threshold voltage may be higher than 1 V and at the same time the charge carrier density may be higher than $n_s=7 \cdot 10^{12}$ cm$^{-2}$.

In some embodiments of the invention, the gate layer may comprise an optional p-type dopant. In some embodiments of the invention, the dopant may be present in a concentration of approximately $1 \cdot 10^{18}$ cm$^{-3}$ to approximately $2 \cdot 10^{20}$ cm$^{-3}$ or of approximately $5 \cdot 10^{18}$ cm$^{-3}$ to approximately $2 \cdot 10^{19}$ cm$^{-3}$. In some embodiments of the invention, the dopant may be present in a concentration such that a hole charge carrier density of approximately $1 \cdot 10^{17}$ cm$^{-3}$ to approximately $2 \cdot 10^{18}$ cm$^{-3}$ at room temperature is achieved. As a result, the threshold voltage may rise further compared to a transistor with lower doping.

In some embodiments of the invention, the gate layer may be configured as a partial coating of the barrier layer, i.e. the gate layer covers only a partial area of the transistor's channel. In some embodiments of the invention, the gate layer is deposited as a full coating and partly removed by etching. In this case, residues may remain on the surface, such that reference may be made to a partial area within the meaning of this description even if the gate layer has the original thickness in first partial areas and a smaller thickness in second partial areas. Said smaller thickness may be less than 5 nm or less than 1 nm or less than 0.5 nm.

In some embodiments of the invention, the gate layer may be a multilayer system composed of a plurality of individual layers. The individual layers of the multilayer system may differ in their respective doping and/or composition.

In some embodiments of the invention, the gate layer may comprise $Al_uIn_vGa_{1-v-u}N$. This ternary or quaternary compound is piezoelectric and therefore can amplify the polarization generated by the gate layer and the buried layer below the gate electrode. As a result, the transistor may show a higher threshold voltage. This may lead to a simplified external circuitry of the semiconductor component, in particular the drive circuit for the gate voltage.

In some embodiments of the invention, the aluminum content of the barrier layer may be selected from the range between approximately 0.20 to approximately 0.35. In some embodiments of the invention, the barrier layer may have a thickness of between approximately 5 nm and approximately 20 nm or between approximately 8 nm and approximately 15 nm.

In some embodiments of the invention, the barrier layer may be nominally undoped, i.e. no dopant is added during the manufacturing of the barrier layer. This does not rule out unavoidable impurities in the barrier layer on account of the manufacturing process.

In some embodiments of the invention, the channel layer may have a thickness of approximately 10 nm and approximately 100 nm. In other embodiments of the invention, the channel layer may have a thickness of between approximately 20 nm and approximately 40 nm. This smaller layer thickness compared with known transistors leads to a higher field strength generated by the polarization generated by the buried layer and the gate layer, such that the transistor in some embodiments has a higher threshold voltage.

In some embodiments of the invention, the channel layer may be nominally undoped, i.e. no dopant is added during the manufacturing of the channel layer. This does not exclude unavoidable impurities in the channel layer due to the manufacturing process.

In some embodiments of the invention, the channel layer may contain or consist of $Al_dGa_{1-d}N$. In some embodiments of the invention, the parameter d may be chosen to be between approximately 0.0 and approximately 0.09. In other embodiments of the invention, the parameter d may be chosen to be between approximately 0.02 and approximately 0.08. In this case, a low Al content generally increases the charge carrier mobility, such that the on-resistance of the transistor may decrease. On the other side, a higher Al content may induce higher polarization charges causing an electrical field across the channel such that the threshold voltage increases further.

In some embodiments of the invention, the field effect transistor according to the invention can be used for applications demanding a high frequency and/or a high current-carrying capacity, for example in radar technology or in mobile radio base stations or in DC converters or in AC inverters or in switching power supplies. In some embodiments, the transistor may be used for switching high loads, for example in an electric motor driver.

In some embodiments of the invention, the concentration of the dopant in the buried layer may be between approximately $1\cdot10^{18}$ cm$^{-3}$ and approximately $2\cdot10^{20}$ cm$^{-3}$. In some embodiments of the invention, this may lead to a concentration of positive charge carriers or holes of between approximately $1\cdot10^{17}$ cm$^{-3}$ and approximately $2\cdot10^{18}$ cm$^{-3}$. In some embodiments of the invention, the dopant may be selected from at least one of the following elements: magnesium and/or carbon and/or zinc. In this case, a higher doping leads to a steeper profile of the potential wells in the channel, such that the energy level of the conduction band below the gate contact rises. As a result, the threshold voltage also rises further, such that the gate voltage of the transistor can be easily controlled. In this case, a higher doping leads to a steeper profile of the potential well and increases the contribution of the polarization charge due to the buried layer.

In some embodiments of the invention, the thickness of the buried layer may be between approximately 20 nm and approximately 150 nm. In other embodiments of the invention, the thickness of the buried layer may be between approximately 60 nm and approximately 90 nm.

In some embodiments of the invention, the aluminum content of the buried layer may be chosen to be between approximately 0.05 and approximately 0.20. In some embodiments of the invention, the aluminum content of the buried layer may be chosen to be between approximately 0.07 and approximately 0.15. These values allow a sufficient polarization voltage to ensure reliable normally off operation. At the same time, the charge carrier concentration in the channel of the field effect transistor is not impaired too much, such that electrical on-resistance is sufficiently low when a gate voltage is applied.

In some embodiments of the invention, the buried layer may contain a plurality of individual layers each comprising p-doped AlGaN. In some embodiments of the invention, the aluminum content may increase starting from the back barrier layer to the channel layer.

In some embodiments of the invention, the aluminum content of the back barrier layer may be selected from approximately 0.04 to approximately 0.1. In some embodiments of the invention, the thickness of the back barrier layer may be selected from approximately 0.1 μm and approximately 1 μm. In other embodiments of the invention, the thickness of the back barrier layer may be selected from between approximately 0.5 μm and approximately 5 μm. The lattice mismatch between the substrate and subsequent layers can be reduced as a result. The thickness of the back barrier layer can be adapted to the lattice mismatch of the underlying substrate if a separate buffer layer is not used.

In some embodiments of the invention, the channel may be delimited by a source and a drain contact, and the length of the channel may be between 1 μm and approximately 50 μm. In some embodiments of the invention, the channel may be delimited by a source and a drain contact, and the length of the channel may be between 10 μm and approximately 30 μm. A longer channel may accommodate a longer gate and a longer gate length may have a positive influence on the threshold voltage, i.e. transistors having longer gates may have higher threshold voltages. For a given charge carrier concentration and charge carrier mobility, a shorter channel has a lower electrical on-resistance, such that high currents may be switched with lower electrical losses in some embodiments.

In some embodiments of the invention, the charge carrier density at the interface between the channel layer and the barrier layer may be more than approximately $5\cdot10^{12}$ cm$^{-2}$ or more than approximately $6\cdot10^{12}$ cm$^{-2}$ or more than approximately $7\cdot10^{12}$ cm$^{-2}$. In some embodiments of the invention, the charge carrier density at the interface between the channel layer and the barrier layer may be less than approximately $2\cdot10^{13}$ cm$^{-2}$. These charge carrier densities enable a sufficiently low on-resistance in the channel, such that the semiconductor component according to the invention is suitable as a power transistor for switching high currents.

In some embodiments of the invention, the threshold voltage may be greater than approximately 0.3 V or greater than approximately 0.5 V. In other embodiments of the invention, the threshold voltage may be greater than approximately 0.85 V or greater than approximately 1.0 V. For the purposes of the present invention, the threshold voltage is understood to be that voltage which must at least be applied to a gate electrode of the field effect transistor in order to achieve a linear rise in the current between drain and source as the gate voltage increases. The threshold voltage thus defines the lowest value of the linear region of the transistor characteristic curve of the field effect transistor.

In some embodiments of the invention, at least one first intermediate layer may be arranged between the back barrier layer and the buried layer. The first intermediate layer can reduce a lattice mismatch and thereby improve the electronic properties of the layer material. In other embodiments of the invention, the intermediate layer can improve the polarization charge of the subsequent layers. In some embodiments of the invention, the intermediate layer may contain or consist of $Al_sGa_{1-s}N$, wherein the parameter s is chosen to be between 0 and approximately 0.20.

In some embodiments of the invention, a second intermediate layer may be arranged between the channel layer and the buried layer, said second intermediate layer comprising or consisting of $Al_RGa_{1-R}N$, wherein the parameter R is chosen to be between 0.05 and 1.

In some embodiments of the invention, a metal layer as gate electrode may be arranged on the gate layer. A dielectric intermediate layer may be arranged between the gate electrode and the gate layer. The intermediate layer can increase the gate voltage swing and/or reduce leakage currents between gate electrode and channel.

In some embodiments of the invention, the dielectric intermediate layer may contain or consist of $SiO_2$ and/or $Si_3N_4$ and/or $Al_2O_3$ and/or $HfO_2$ and/or $Ga_2O_3$ and/or AlN and/or $TaO_x$ and/or $Gd_2O_3$.

BRIEF DESCRIPTION OF THE DRAWINGS

The invention will be explained in greater detail below with reference to exemplary embodiments without restricting the general concept of the invention. The embodiments may be better understood with reference to the following drawings and description. The components in the figures are not necessarily to scale. Moreover, in the figures, like-referenced numerals designate corresponding parts throughout the different views.

FIG. 1 illustrates the basic construction of a semiconductor component according to the invention.

FIG. 2 illustrates a first exemplary embodiment of the transistor according to the invention.

DETAILED DESCRIPTION

Figure 3:
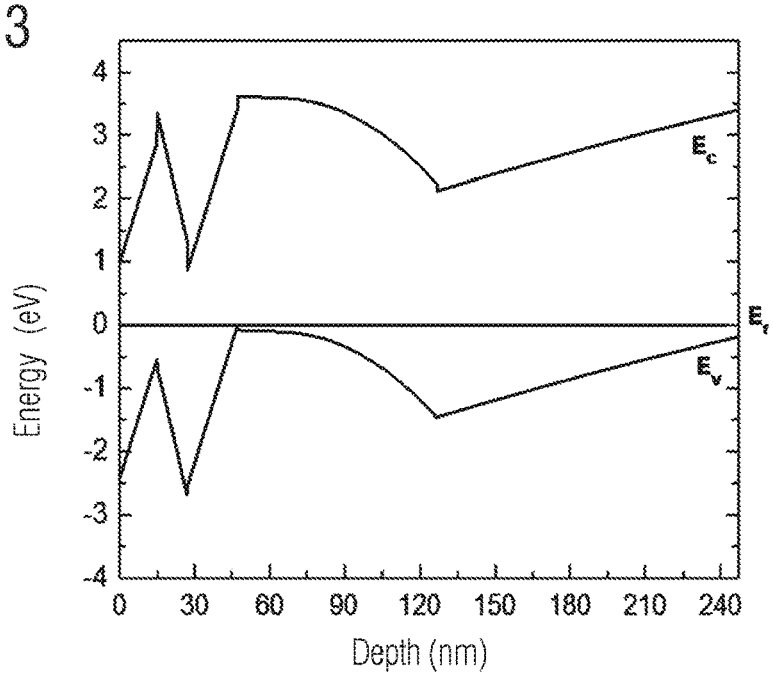
FIG. 3 illustrates the calculated band diagram of the gate region of the transistor according to the first exemplary embodiment.

By way of an introductory example, FIG. 1 shows the basic construction of a transistor 1, which may be part of a semiconductor component according to the invention. The transistor 1 may preferably be manufactured by lateral structuring, i.e. as a planar component.

The transistor 1 may be manufactured together with other parts of the semiconductor component on a substrate 9. In some embodiments of the invention, the substrate may comprise or consist of any of SOI (Silicon-on-insulator) and/or $Al_2O_3$ and/or SiC and/or Si and/or GaN and/or $SiO_2$. In some embodiments of the invention the substrate itself may consist of a plurality of individual layers being made from different materials. In some embodiments of the invention, the substrate may be monocrystalline. The substrate may have a diameter of approximately 5 cm to approximately 30 cm or of approximately 10 cm to approximately 20 cm. In some embodiments, the substrate may be removed after the manufacturing of the transistor, for example by etching. In other embodiments of the invention, the substrate may remain below the optional buffer layer 95 in order to facilitate the handling of the transistor in this way.

Firstly, an optional buffer layer 95 is deposited on the substrate. The deposition of the buffer layer 95 may be carried out from the gas phase by methods known in the art, for example by MBE, MOCVD or MOVPE. The buffer layer 95 may comprise or consist of a binary or ternary or quaternary compound comprising at least one element of main group III and nitrogen. The buffer layer 95 may comprise or consist of a plurality of individual layers. In this case, the composition of the individual layers may change step by step or continuously between the surface of the substrate 9 and the interface of the back barrier layer 2. The buffer layer 95 may be used to reduce the lattice mismatch between the subsequent layers and the substrate 9, such that subsequent layers grow with higher quality and the charge carrier mobility and the threshold voltage rise and the electrical on-resistance decreases as a result. The buffer layer may have a thickness of between approximately 500 nm and approximately 6000 nm. In other embodiments of the invention, the thickness of the back barrier layer may be between 1000 nm and 4000 nm.

A back barrier layer 2 is subsequently deposited on the substrate 9 or on the buffer layer 95. The deposition of the back barrier layer may be carried out from the gas phase by methods known in the art, for example by MBE, MOCVD or MOVPE. The back barrier layer comprises $Al_yGa_{1-y}N$. In some embodiments of the invention, y may be chosen to be between approximately 0.04 and approximately 0.1. if no buffer layer 95 is present, the back barrier layer may be used to reduce the lattice mismatch between the subsequent layers and the substrate. The back barrier layer may have a thickness of between approximately 100 nm and approximately 1000 nm. In other embodiments of the invention, the thickness of the back barrier layer may be between 500 nm and 5000 nm.

A buried layer 3 is grown onto the back barrier layer. The buried layer 3 comprises $Al_xGa_{1-x}N$. In some embodiments of the invention, the parameter x may be chosen to be between approximately 0.05 and approximately 0.15. In addition, the buried layer comprises a dopant that brings about a p-type conductivity of the buried layer. In some embodiments of the invention, the concentration of the dopant may be between approximately $1 \cdot 10^{18}$ cm$^{-3}$ and approximately $2 \cdot 10^{20}$ cm$^{-3}$. The buried layer may have a thickness of approximately 20 nm to approximately 150 nm. The buried layer in interaction with the gate layer 6 generates a piezoelectric field which acts on the material in the channel of the field effect transistor and brings about band bending as a result. As a result, the conduction band minimum can be raised above the Fermi level, such that the transistor has a high resistance or is non-conducting as long as no gate voltage is present at the gate 61. In the event of a gate voltage being applied, the conduction band minimum can be moved below the Fermi level, such that the transistor has a low resistance or becomes conducting. Such behavior is referred to as "normally off" for the purposes of the present invention. The charge carrier density $n_s$ of the conducting transistor may be more than $5 \cdot 10^{12}$ cm$^{-2}$.

A channel layer 4 is arranged on the buried layer 3 directly or by means of at least one intermediate layer. No intermediate layer is illustrated in FIG. 1. The channel layer 4 may comprise GaN. In other embodiments of the invention, the channel layer 4 may comprise or consist of $Al_dGa_{1-d}N$. In some embodiments of the invention, d may be chosen to be between approximately 0.02 and approximately 0.09. In some embodiments of the invention, the channel layer may have a thickness of between approximately 10 nm and approximately 100 nm or between approximately 20 nm and approximately 40 nm.

Finally, a barrier layer 5 is manufactured on the channel layer 4. Said barrier layer 5 constitutes a Schottky barrier on the channel layer 4. The barrier layer comprises $Al_zGa_{1-z}N$. A two-dimensional electron gas forms at the interface 45 between the channel layer 4 and the barrier layer 5. The parameter z may be chosen to be between approximately 0.2 and approximately 0.35. The layer thickness of the barrier layer 5 may be between approximately 5 nm and approximately 20 nm or between approximately 8 nm and approximately 15 nm.

Finally, a gate layer 6 is manufactured on the barrier layer 5. The gate layer 6 comprises nominally undoped GaN. The gate layer may have a thickness of approximately 20 nm to approximately 40 nm. The gate layer may either be manufactured only on the partial areas of the surface which are provided for receiving the gate electrode 61. Alternatively, the gate layer 6 may be deposited over the whole area and subsequently be at least partly removed from the surface by structuring and etching.

Finally, a metallic gate electrode 61 is deposited on the gate layer 6. By applying a voltage to the gate electrode 61, it is possible to influence the electrical resistance in the channel between the source electrode 71 and the drain electrode 72, such that the transistor can be used as an amplifier or a switch in a manner known in the art.

The source and drain electrodes 71 and 72 are also deposited as metal layer onto the barrier layer 5 either directly or with adhesion promoting layers arranged therebetween. The source electrode 71, the drain electrode 72 and/or the gate electrode 61 may be embodied as a multilayer and comprise a plurality of semiconducting or conducting layers composed of metals or alloys. The invention does not teach the use of specific contact materials as a solution principle.

The subsequent figures show specific embodiments of this general concept of the invention. For reasons of simplification, the substrate 9 and the buffer layer 95 are not illustrated in the subsequent figures. However, these elements may be present in these illustrative embodiments as well.

FIG. 2 shows one specific exemplary embodiment of the basic structure illustrated in FIG. 1. In the exemplary embodiment illustrated, the back barrier layer 2 has a thickness of 120 nm and an aluminum content of 0.07. The buried layer 3 has a thickness of 80 nm and an aluminum content of 0.12. The buried layer 3 is p-doped and has a charge carrier concentration of $4 \cdot 10^{17}$ cm$^{-3}$. Mg is used as a dopant in the exemplary embodiment illustrated.

The channel layer comprises nominally undoped GaN with a thickness of 20 nm. A barrier layer having a thickness of 12 nm is deposited thereon, said barrier layer having an aluminum content of 0.26. The gate layer 6 comprises nominally undoped GaN and has a thickness of 15 nm.

The partial areas not covered by the source, drain and gate electrodes are provided with an optional passivation layer 8, which prevents fluctuation of the surface potential of the barrier layer 5. In the exemplary embodiment illustrated, the passivation layer 8 comprises SiN.

FIG. 3 shows the calculated band structure of the semiconductor heterostructure under the gate region in accordance with FIG. 2. The calculation is carried out using a one-dimensional, self-consistent Schrödinger-Poisson approach. Energy is plotted against depth in FIG. 3. The illustration shows the profile of the conduction band, of the valence band and the Fermi level. As can be seen from FIG. 3, the conduction band minimum is approximately 0.85 eV above the Fermi level if no gate voltage is present. This means that no free charge carriers are present in the conduction band, such that the semiconductor heterostructure has a comparatively high resistance or is non-conducting. It is only as a result of an electrical voltage being applied to the gate electrode that the Fermi level shifts to an extent such that a two-dimensional electron gas is also formed below the gate electrode. As a result, the conductivity of the channel between source and drain electrodes increases rapidly, such that the transistor is conductive. The transistor according to the invention thus exhibits a normally off behavior.

Figure 4:
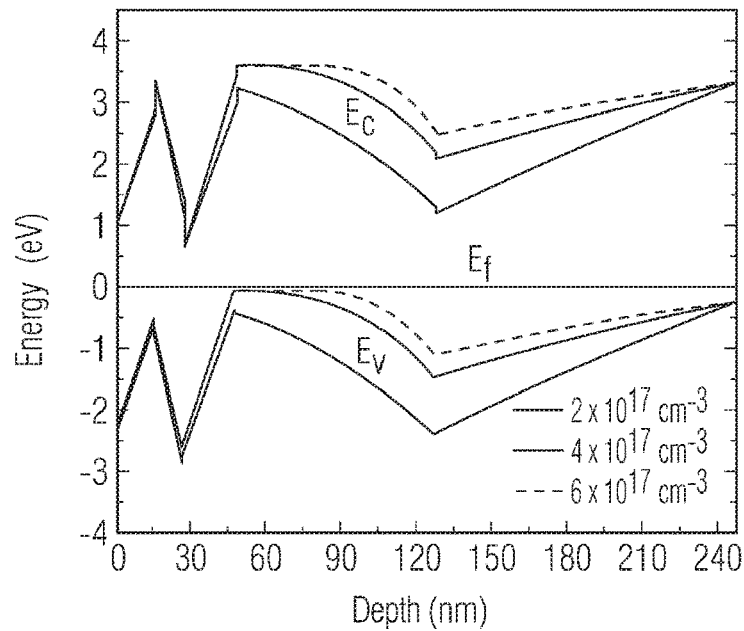
FIG. 4 illustrates the influence of different doping of the buried layer on the band diagram.

FIG. 4 shows the influence of different dopant concentrations of the buried layer on the profile of valence and conduction bands. The illustration shows the profiles of the valence and conduction bands for three values of the charge carrier concentration, namely $2 \cdot 10^{17}$ cm$^{-3}$, $4 \cdot 10^{17}$ cm$^{-3}$ and $6 \cdot 10^{17}$ cm$^{-3}$. As can be seen from FIG. 4, the dopant concentration of the buried layer 3 lifts-up the conduction band profile in the buried layer, and only slightly enhances the band profile between the barrier layer 5 and the channel layer 4. Consequently, all embodiments exhibit a normally off behavior and may yield to a more positive threshold voltage within the increase of the dopant concentration of the buried layer 3.

A second embodiment of the invention is illustrated with reference to FIG. 5. Like reference numbers designate like parts of the invention, so that the following description is limited to differences between the embodiments shown.

Figure 5:
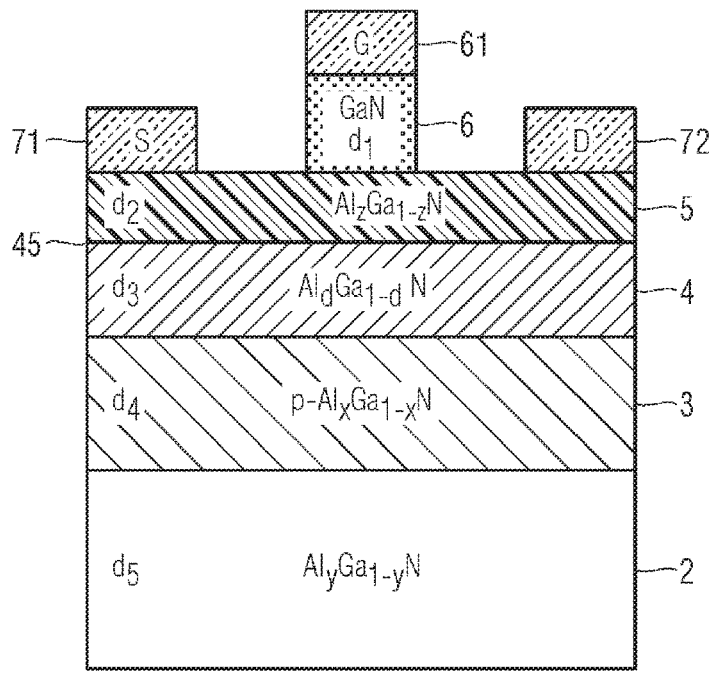
FIG. 5 illustrates a second exemplary embodiment of the transistor according to the invention.

The second embodiment in accordance with FIG. 5 also uses a back barrier layer 2 having a thickness of 120 nm and an aluminum content of y=0.07. The buried layer 3 arranged thereon has an aluminum content of x=0.12. The dopant concentration is reduced somewhat in comparison with the first embodiment and amounts $3 \cdot 10^{17}$ cm$^{-3}$. The layer thickness of the buried layer 3 is likewise reduced in comparison with the first embodiment and is approximately 65 Nm.

A channel layer 4 made from AlGaN having a thickness of 25 nm and an aluminum content of 4% is arranged on the buried layer. A barrier layer 5 is deposited on the channel layer 4, having a thickness of 25 nm and an aluminum content of 26% as described above. A gate layer 6 made from nominally undoped GaN is situated below the gate electrode 61, said gate layer having a layer thickness of 15 nm.

Figure 6:
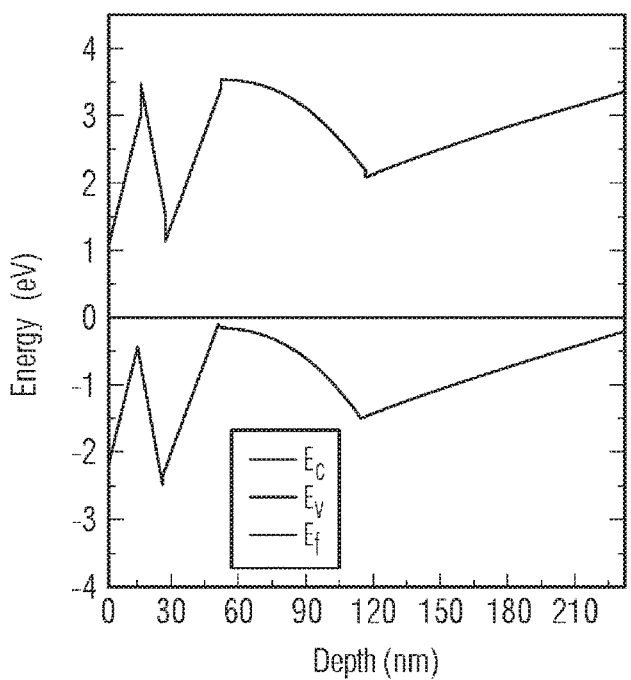
FIG. 6 illustrates the calculated band diagram of the gate region of the transistor according to the second exemplary embodiment.

FIG. 6 shows the calculated band diagram of the second embodiment of the invention below the gate. In this case, too, the conduction band minimum is above the Fermi level if no gate voltage is present at the gate electrode 61. The separation between the conduction band minimum and the Fermi energy with a value of 1.0 eV is somewhat greater than that determined for the first exemplary embodiment.

The charge carrier density at the interface 45 is $8.3 \cdot 10^{12}$ cm$^{-2}$. This value, too, is slightly greater than in the first exemplary embodiment, in which the charge carrier density is $7.5 \cdot 10^{12}$ cm$^{-2}$.

Figure 7:
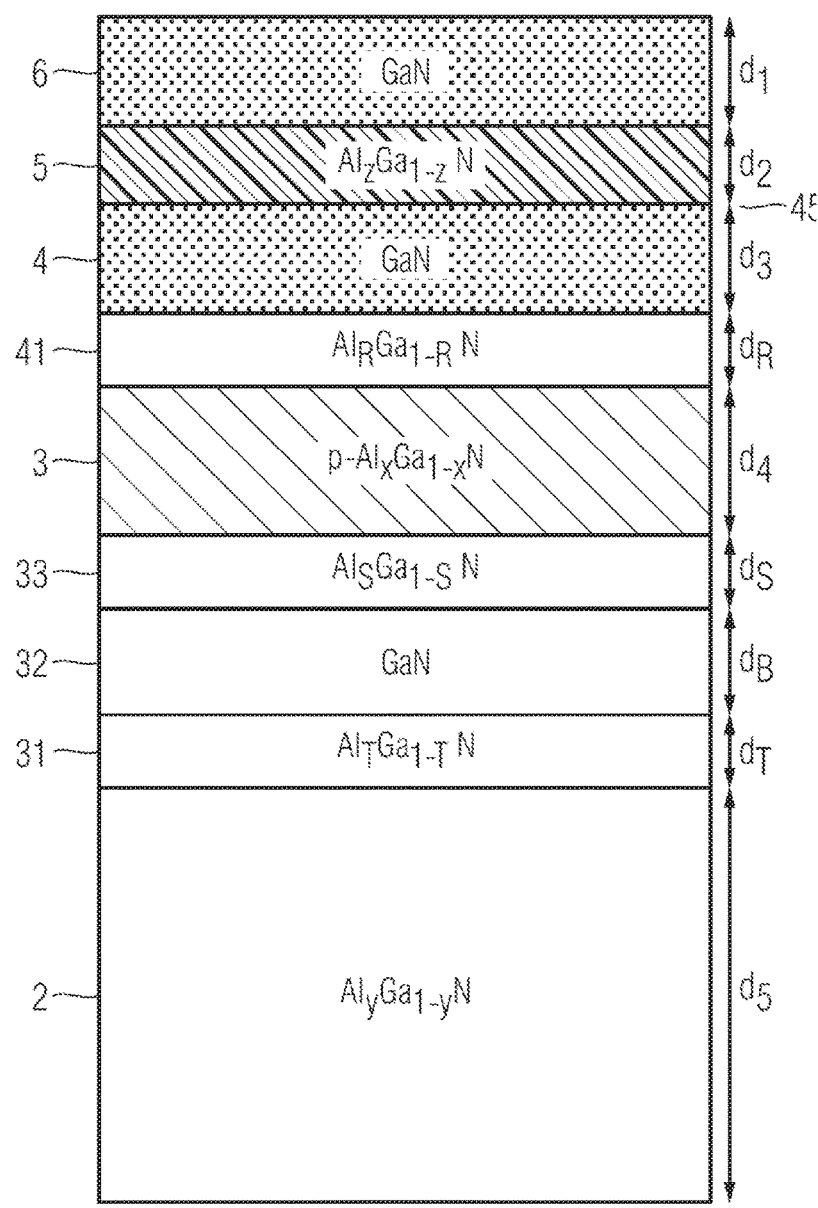
FIG. 7 illustrates a third exemplary embodiment of the transistor according to the invention.

FIG. 7 shows a third embodiment of the present invention. For reasons of simplification, the source, drain and gate contacts are not illustrated in FIG. 7. They can be realized in a similar manner than described with respect to the previous embodiments by partly removing the gate layer 6 and providing the free surface regions with corresponding contact elements.

The third embodiment of the invention is distinguished by the fact that at least one first intermediate layer is arranged between the back barrier layer and the buried layer 3. In the exemplary embodiment illustrated, the first intermediate layer is constructed from a three-layered layer system comprising a first individual layer 31, a second individual layer 32 and a third individual layer 33. In this case, the first and third individual layers comprise $Al_sGa_{1-s}N$ and $Al_rGa_{1-r}N$, respectively. The aluminum content S and T of the first intermediate layer 31 and of the third intermediate layer 33 may vary.

In some embodiments of the invention, the parameters s and t may be chosen to be between 0.09 and 0.15. The layer thicknesses of the single individual layer 31, 32 and 33 may be between approximately 5 nm and approximately 15 nm.

A second individual layer 32, which comprises or consists of GaN, is arranged between the first individual layer 31 and the third individual layer 33. The intermediate layers can amplify the field induced by the polarization and, as a result, either raise the threshold voltage further and/or further improve the confinement of the two-dimensional electron gas at the interface 45 between channel layer and barrier layer.

The number of individual layers in the multilayer system forming the first intermediate layer may be greater or less than is illustrated in FIG. 7 and may be between 1 and approximately 20, for example. In other embodiments of the invention, the number of individual layers may be between two and five. The invention does not teach the use of exactly three individual layers as a solution principle.

FIG. 7 furthermore shows an optional second intermediate layer 41, which comprises or consists of $Al_rGa_{1-r}N$. The latter may be arranged between the buried layer 3 and the channel layer 4. In some embodiments of the invention, the layer thickness may be between approximately 2 nm and approximately 30 nm. The aluminum content r may be between approximately 0.05 and 1. This second intermediate layer 41, too, may be constituted as a layer system composed of a plurality of individual layers that are deposited epitaxially one above another.

A calculation of the band structure of the semiconductor structure illustrated in FIG. 7 likewise shows that the conduction band minimum is above the Fermi level, such that the semiconductor structure shown in FIG. 7 is suitable for producing a transistor having normally off behavior.

A fourth embodiment of the invention is explained with reference to FIG. 8. The fourth embodiment of the invention exhibits a buried layer 3 comprising a plurality of individual layers 21, 22 and 23. The number of individual layers is not fixed at exactly three. Rather, this number may be greater or else smaller and be between approximately 2 and approximately 30, for example. The individual layers 21, 22, ... may have a thickness of 2 to 10 nm, for example.

Each individual layer comprises p-doped $Al_xGa_{1-x}N$. In this case, the dopant just like the aluminum content X may be chosen differently in different individual layers. In some embodiments of the invention, the aluminum content may increase proceeding from the back barrier layer 2 to the channel layer 4.

Figure 8:
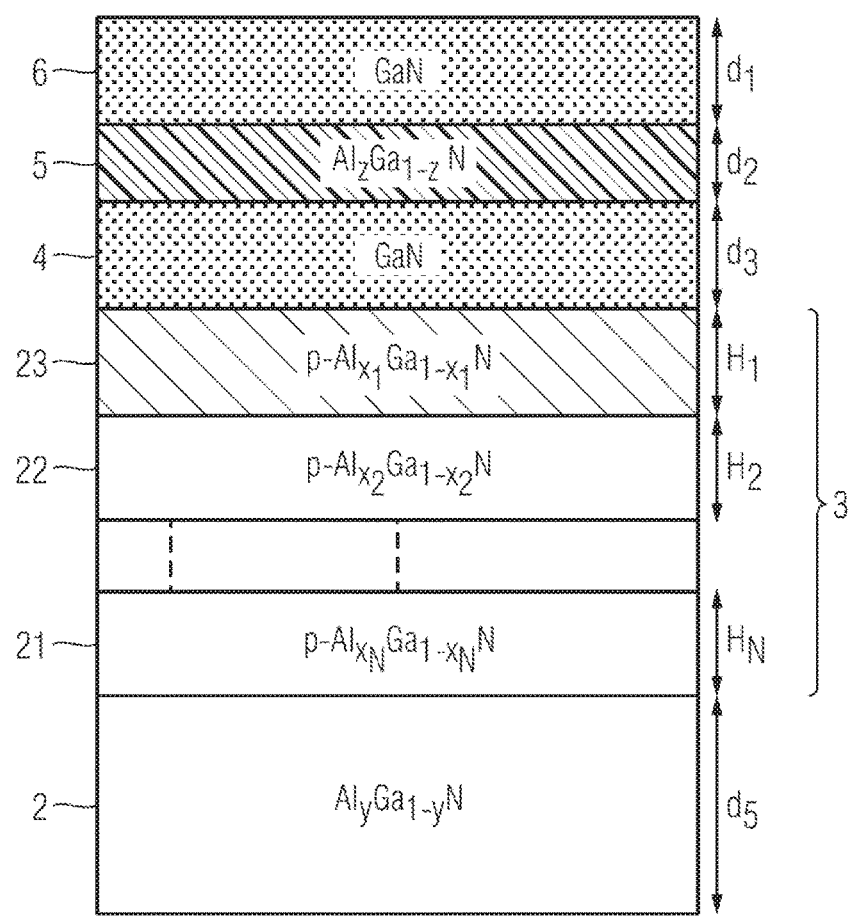
FIG. 8 illustrates a fourth exemplary embodiment of the transistor according to the invention.
Figure 9:
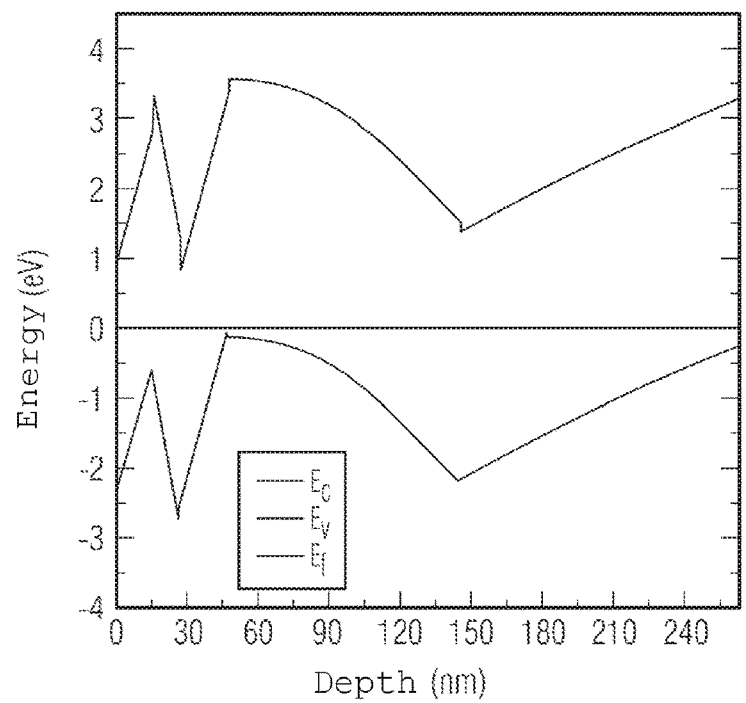
FIG. 9 illustrates the calculated band diagram of the gate region of the transistor according to the fourth exemplary embodiment.

FIG. 9 shows the calculated band diagram of the semiconductor structure illustrated in FIG. 8. Here, too, it becomes clear that the conduction band minimum is above the Fermi level, such that the semiconductor structure is suitable for producing a normally off transistor.

Figure 10:
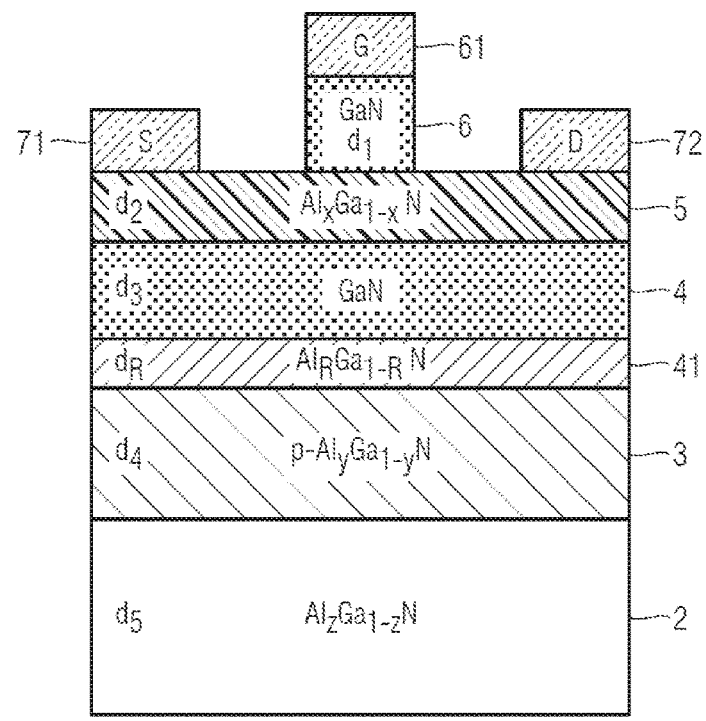
FIG. 10 illustrates a fifth exemplary embodiment of the transistor according to the invention.

FIG. 10 shows a fifth embodiment of the present invention. The fifth embodiment is similar to the third embodiment illustrated in FIG. 7, and so the following description is restricted to the essential differences.

The fifth embodiment of the invention is also distinguished by the fact that a second intermediate layer 41 is arranged between the channel layer 4 and the buried layer 3, said second intermediate layer comprising or consisting of $Al_rGa_{1-r}N$. In some embodiments of the invention, the layer thickness may be between approximately 10 nm and approximately 30 nm. The aluminum content r may be between approximately 0.1 and 0.30. In the case of the fifth embodiment of the invention, however, no first intermediate layer is situated between the back barrier layer 2 and the buried layer 3.

Figure 11:
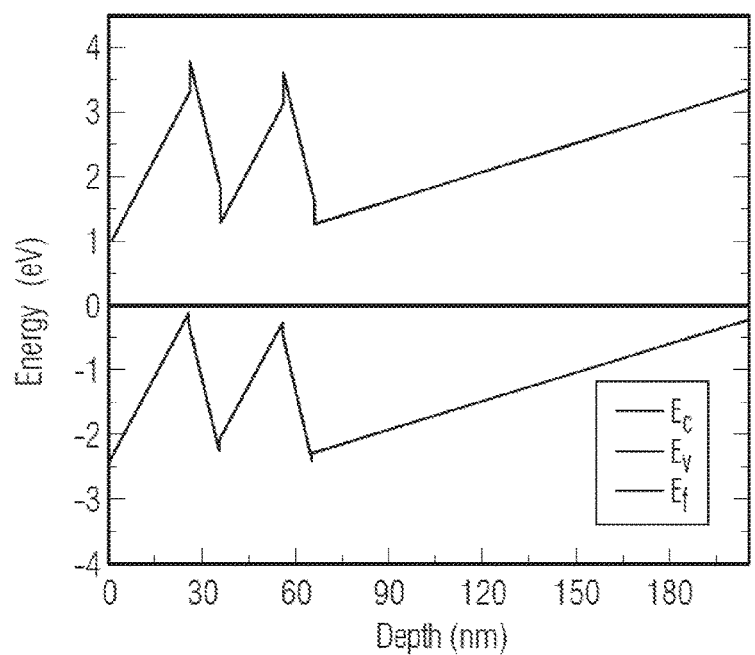
FIG. 11 illustrates the calculated band diagram of the gate region of the transistor according to the fifth exemplary embodiment.

A calculated band structure of the fifth embodiment of the semiconductor structure according to the invention is illustrated with reference to FIG. 11. As can be seen from FIG. 11, in this case, too, the conduction band minimum is above the Fermi level, such that the semiconductor structure shown in FIG. 10 is likewise suitable for producing a transistor having normally off behavior. The potential well formed by the conduction band is 1.28 eV above the Fermi level, thus resulting in a distinctly positive threshold voltage of the transistor. The potential profile nevertheless enables a good confinement of the two-dimensional electron gas.

The calculated charge carrier density of the transistor in accordance with the fifth embodiment is $9.5 \cdot 10^{12}$ cm$^{-2}$ To summarize, the invention discloses for the first time semiconductor structures which can be used to provide field effect transistors having threshold voltages of more than 0.5 V or more than 0.85 V or more than 1.0 V. The present invention thus discloses for the first time field effect transistors which combine the advantageous properties of components on the basis of group III nitrides with the advantages of normally off transistors and at the same time have a threshold voltage which is controllable in a simple manner and thus requires only a low circuit complexity.

It should be emphasized that the invention is not restricted to the embodiments illustrated. Therefore, the above description should not be regarded as restrictive, but rather as explanatory. The following claims should be understood such that a feature mentioned is present in at least one embodiment of the invention. This does not preclude the presence of further features. In so far as the claims and the above description define "first" and "second" elements or "first" and "second" embodiments, this designation serves for differentiating between two embodiments or elements of the same type, without defining a rank order.

The invention claimed is:

1. A semiconductor component comprising at least one field effect transistor, said transistor comprising at least
a back barrier layer,
a buried layer arranged on the back barrier layer,
a channel layer arranged on the buried layer,
a barrier layer arranged on the channel layer, and
a gate layer arranged on the barrier layer,
wherein the barrier layer comprises $Al_zGa_{1-z}N$, the buried layer comprises $Al_xGa_{1-x}N$ and at least one dopant causing a p-type conductivity, the gate layer comprises any of GaN and/or $Al_uIn_vGa_{1-v-u}N$, and a charge carrier density at an interface between the channel layer and the barrier layer is higher than approximately $5 \cdot 10^{12}$ cm$^{-2}$.

2. The semiconductor component according to claim 1, wherein the gate layer has a thickness being selected from approximately 10 nm to approximately 100 nm.

3. The semiconductor component according to claim 1, wherein the channel layer has a thickness being selected from approximately 10 nm to approximately 100 nm.

4. The semiconductor component according to claim 1, wherein a concentration of the at least one dopant in the buried layer is selected from approximately $1 \cdot 10^{18}$ cm$^{-3}$ to approximately $2 \cdot 10^{20}$ cm$^{-3}$ and/or
wherein the thickness of the buried layer is selected from approximately 20 nm to approximately 150 nm.

5. The semiconductor component according to claim 1, wherein the parameter x is selected from approximately 0.05 to approximately 0.20 and/or
wherein the parameter z is selected from approximately 0.20 to approximately 0.35.

6. The semiconductor component according to claim 1, wherein a source and a drain contact are arranged adjacent to the channel layer to define a channel, and a length of the channel between the source and the drain contact is between approximately 1 μm and approximately 50 μm.

7. The semiconductor component according to claim 6, wherein the gate layer is constituted by a partial coating being located between said source and drain contacts.

8. The semiconductor component according to claim 1, being configured to show a gate threshold voltage which is higher than approximately 0.5 V.

9. The semiconductor component according to claim 1, wherein the gate layer is nominally undoped.

10. The semiconductor component according to claim 1, wherein the buried layer comprises a plurality of individual sublayers each comprising p-doped AlGaN, wherein the aluminum content increases proceeding from the back barrier layer to the channel layer.

11. The semiconductor component according to claim 1, wherein the back barrier layer comprises a p-type dopant, said dopant comprising at least one element from the following list: magnesium, carbon, zinc, and beryllium.

12. The semiconductor component according to claim 1, comprising a first intermediate layer arranged between the back barrier layer and the buried layer comprises or consists of $Al_sGa_{1-s}N$ or GaN.

13. The semiconductor component according to claim 12, wherein a second intermediate layer is arranged between the channel layer and the buried layer, wherein said second intermediate layer comprises or consists of $Al_RGa_{1-R}N$, wherein the parameter R is chosen between 0.05 and 1.

14. The semiconductor component according to claim 1, wherein the channel layer comprises any of nominally undoped GaN or nominally undoped $Al_dGa_{1-d}N$.

15. A semiconductor component comprising at least one field effect transistor, said transistor comprising at least
a back barrier layer,
a buried layer arranged on the back barrier layer,
a channel layer arranged on the buried layer,
a barrier layer consisting of $Al_zGa_{1-z}N$ arranged on the channel layer, and
a gate layer consisting of any of GaN or $Al_uIn_vGa_{1-v-u}N$ arranged on the barrier layer,
wherein a charge carrier density at an interface between the channel layer and the barrier layer is higher than approximately $5 \cdot 10^{12}$ cm$^{-2}$, and the buried layer comprises $Al_xGa_{1-x}N$ and at least one dopant causing a p-type conductivity in a concentration of at least $1 \cdot 10^{18}$ cm$^{-3}$ and not more than $2 \cdot 10^{20}$ cm$^{-3}$.

16. The semiconductor component according to claim 15, wherein the gate layer has a thickness being selected from approximately 10 nm to approximately 100 nm.

17. The semiconductor component according to claim 15, wherein the channel layer has a thickness being selected from approximately 10 nm to approximately 100 nm.

18. The semiconductor component according to claim 15, wherein the parameter x is selected from approximately 0.05 to approximately 0.20 and/or
wherein the parameter z is selected from approximately 0.20 to approximately 0.35.

19. The semiconductor component according to claim 15, wherein the gate layer is nominally undoped.

\* \* \* \* \*